US007282735B2

(12) United States Patent
Wu et al.

(10) Patent No.: US 7,282,735 B2
(45) Date of Patent: Oct. 16, 2007

(54) TFT HAVING A FLUOROCARBON-CONTAINING LAYER

(75) Inventors: Yiliang Wu, Mississauga (CA); Ping Liu, Mississauga (CA); Beng S Ong, Mississauga (CA)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 11/276,694

(22) Filed: Mar. 10, 2006

(65) Prior Publication Data

US 2006/0220009 A1 Oct. 5, 2006

Related U.S. Application Data

(60) Provisional application No. 60/666,997, filed on Mar. 31, 2005.

(51) Int. Cl.
*H01L 29/08* (2006.01)

(52) U.S. Cl. .................. 257/40; 257/642; 257/E21.007; 257/E21.024; 257/E21.299; 257/E27.117; 438/99

(58) Field of Classification Search ...................... None
See application file for complete search history.

(56) References Cited

U.S. PATENT DOCUMENTS

| | | | |
|---|---|---|---|
| 6,433,359 B1 | 8/2002 | Kelley et al. | |
| 6,676,857 B2 * | 1/2004 | Heeney et al. | ............. 252/500 |
| 6,770,904 B2 | 8/2004 | Ong et al. | |
| 6,855,951 B2 | 2/2005 | Ong et al. | |
| 7,211,679 B2 * | 5/2007 | Gerlach et al. | ............... 549/71 |
| 2003/0102471 A1 * | 6/2003 | Kelley et al. | ............... 257/40 |
| 2003/0102472 A1 | 6/2003 | Kelley et al. | |
| 2005/0042430 A1 * | 2/2005 | Toyoda | ....................... 428/209 |

OTHER PUBLICATIONS

F. Garnier et al., "All-Polymer Field-Effect Transistor Realized by Printing Techniques," Science, vol. 265, pp. 1684-1686 (Sep. 16, 1994).
A. Salleo et al., "Polymer thin-film transistors with chemically modified dielectric interfaces," Applied Physics Letters, vol. 81, No. 23, pp. 4383-4385 (Dec. 2, 2002).
Laura Kosbar et al., "The effect of surface preparation on the structure and electrical transport in an organic semiconductor," Mat. Res. Soc. Symp. Proc., vol. 665, pp. 401-406 (2001).
S. Kobayashi et al., "Control of carrier density by self-assembled monolayers in organic field-effect transistors," Nature Materials, pp. 317-322 and 2 pages of Supplemental Information (published online Apr. 4, 2004).
Janos Veres et al., "Gate insulators in organic field-effect transistors," Chem. Mater.vol. 16, pp. 4543-4555 (published on web Sep. 11, 2004).

(Continued)

*Primary Examiner*—Thomas Dickey
*Assistant Examiner*—Scott R. Wilson
(74) *Attorney, Agent, or Firm*—Zosan Soong

(57) ABSTRACT

A thin film transistor composed of: (a) a semiconductor layer including a thiophene compound, wherein the thiophene compound comprises one or more substituted thiophene units, one or more unsubstituted thiophene units, and optionally one or more divalent linkages; (b) a gate dielectric; and (c) a layer contacting the gate dielectric disposed between the semiconductor layer and the gate dielectric, wherein the layer comprises a substance comprising a fluorocarbon structure.

13 Claims, 2 Drawing Sheets

OTHER PUBLICATIONS

Y.Y. Lin et al., "Pentacene-Based Organic Thin-Film Transistors," IEEE Transactions on Electron Devices, vol. 44, pp. 1325-1331 (1997).

H. Sirringhaus et al., "Integrated Optoelectronic Devices Based on Conjugated Polymers," Science, vol. 280, pp. 1741-1744 (1998).

* cited by examiner

TFT HAVING A FLUOROCARBON-CONTAINING LAYER

CROSS-REFERENCE TO RELATED APPLICATIONS

This application claims the benefit of U.S. Provisional Application No. 60/666,997, filed Mar. 31, 2005, the disclosure of which is totally incorporated herein by reference.

STATEMENT REGARDING FEDERALLY SPONSORED RESEARCH OR DEVELOPMENT

This invention was made with United States Government support under Cooperative Agreement No. 70NANBOH3033 awarded by the National Institute of Standards and Technology (NIST). The United States Government has certain rights in the invention.

BACKGROUND OF THE INVENTION

There are a number of approaches to improving the performance of organic thin film transistors ("TFT"). One approach is to chemically modify the surface of the gate dielectric prior to deposition of the semiconductor layer as described in a number of the documents listed below. Further improvements in performance are needed to promote the use of organic TFTs in the marketplace. In response to the need for enhanced TFT performance, the present inventors have developed an improved organic TFT and a process for fabricating the improved organic TFT.

The following documents provide background information:

Ong et al., U.S. Pat. No. 6,770,904 B2.

Ong et al., U.S. Pat. No. 6,855,951 B2.

Kelley et al., U.S. Patent Application Publication 2003/0102471 A1.

Kelley et al., U.S. Patent Application Publication 2003/0102472 A1.

Kelley et al., U.S. Pat. No. 6,433,359 B1.

F. Garnier et al., "All-Polymer Field-Effect Transistor Realized by Printing Techniques," *Science*, Vol. 265, pp. 1684-1686 (Sep. 16, 1994).

A. Salleo et al., "Polymer thin-film transistors with chemically modified dielectric interfaces," *Applied Physics Letters*, Vol. 81, No. 23, pp. 4383-4385 (Dec. 2, 2002).

Laura Kosbar et al., "The effect of surface preparation on the structure and electrical transport in an organic semiconductor," *Mat. Res. Soc. Symp. Proc.*, Vol. 665, pp. 401-406 (2001).

S. Kobayashi et al., "Control of carrier density by self-assembled monolayers in organic field-effect transistors," *Nature Materials*, pp. 317-322 and 2 pages of Supplemental Information (published online Apr. 4, 2004).

Janos Veres et al., "Gate insulators in organic field-effect transistors," *Chem. Mater.* Vol. 16, pp. 4543-4555 (published on web Sep. 11, 2004).

Y. Y. Lin et al., "Pentacene-Based Organic Thin-Film Transistors," *IEEE Transactions on Electron Devices*, Vol. 44, pp. 1325-1331 (1997).

H. Sirringhaus et al., "Integrated Optoelectronic Devices Based on Conjugated Polymers," *Science*, Vol. 280, pp. 1741-1744 (1998).

SUMMARY OF THE DISCLOSURE

In embodiments, there is provided a thin film transistor comprising:
  (a) a semiconductor layer including a thiophene compound, wherein the thiophene compound comprises one or more substituted thiophene units, one or more unsubstituted thiophene units, and optionally one or more divalent linkages;
  (b) a gate dielectric; and
  (c) a layer contacting the gate dielectric disposed between the semiconductor layer and the gate dielectric, wherein the layer comprises a substance comprising a fluorocarbon structure.

There is also provided in embodiments a thin film transistor comprising:
  (a) a semiconductor layer including a thiophene compound, wherein the thiophene compound comprises one or more substituted thiophene units, one or more unsubstituted thiophene units, and optionally one or more divalent linkages, wherein the thiophene compound is a polymer;
  (b) a gate dielectric; and
  (c) a layer contacting the gate dielectric disposed between the semiconductor layer and the gate dielectric, wherein the layer comprises a fluoroalkylsilane or a fluoroalkylphosphine, or a mixture thereof.

There is further provided in embodiments a process for fabricating a thin film transistor comprising:
  (a) forming a gate dielectric;
  (b) forming a layer including a substance comprising a fluorocarbon structure; and
  (c) forming a semiconductor layer including a thiophene compound comprising one or more substituted thiophene units, one or more unsubstituted thiophene units, and optionally one or more divalent linkages,
  wherein the layer contacts the gate dielectric and is disposed between the semiconductor layer and the gate dielectric.

BRIEF DESCRIPTION OF THE DRAWINGS

Other aspects of the present invention will become apparent as the following description proceeds and upon reference to the following figures which represent exemplary embodiments.

Unless otherwise noted, the same reference numeral in different Figures refers to the same or similar feature.

DETAILED DESCRIPTION

Figure 1:
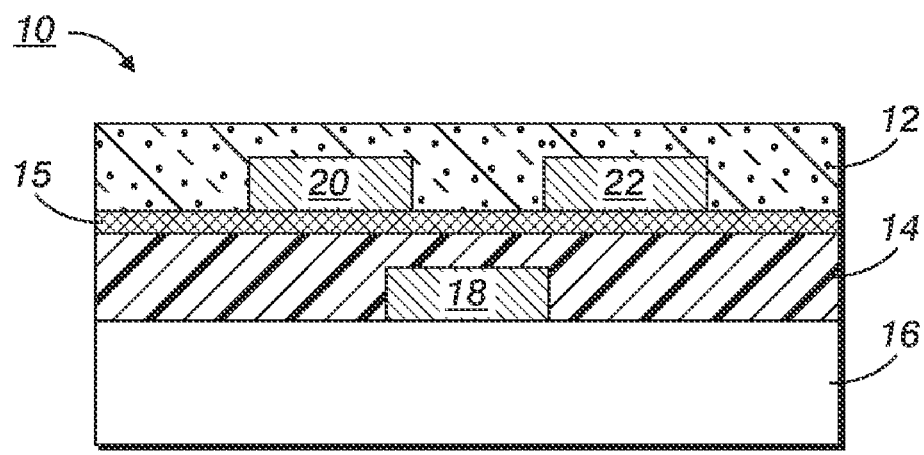
FIG. 1 represents a first embodiment of the present invention in the form of a thin film transistor.

A thin film transistor generally includes a gate electrode, a gate dielectric, a source electrode, a drain electrode, a semiconductor layer and an optional encapsulation layer. According to the present disclosure, the thin film transistor further contains a layer which is disposed between the semiconductor layer and the gate dielectric, wherein the layer comprises a substance comprising a fluorocarbon structure. In embodiments, the layer is a self-assembly monolayer ("SAM"). In other embodiments, there is present a plurality of two or more layers ("multi-layers") between the semiconductor layer and the gate dielectric, wherein each layer of the multi-layers comprises the same or different substance with the same or different fluorocarbon structure. In embodiments, the fluorocarbon structure is a fluorine-containing polymer (having a degree of polymerization n of 2 or more such as for example 2 to about 100). The SAM has a thickness for example of less than about 5 nanometers, less than about 2 nanometers. Each layer of the multi-layers has a thickness for example of from about 2 nanometers to about 500 nanometers, from about 5 nanometers to about 100 nanometers. In embodiments, the layer is a crosslinked layer. In embodiments, the substance is covalently bonded to the gate dielectric surface. In other embodiments, the substance is not covalently bonded to the gate dielectric surface. In embodiments, the layer is a SAM comprising a substance covalently bonded to the gate dielectric surface.

In embodiments, the phrase "fluorocarbon structure" refers to an organic compound/organic moiety analogous to hydrocarbons in which one or more hydrogen atoms has been replaced by fluorine. The fluorocarbon structure can be a small molecule structure or a polymeric structure. The fluorocarbon structure could be a linear or branched structure. The fluorocarbon structure could be aliphatic, cyclic aliphatic, aromatic structure, or mixture thereof. The phrase "fluorocarbon structure" encompasses "substituted fluorocarbon structure" and "unsubstituted fluorocarbon structure." In embodiments, the phrase "substituted fluorocarbon structure" refers to replacement of one or more hydrogen atoms of the fluorine-containing organic compound/organic moiety with Cl, Br, I and a heteroatom-containing group such as for example CN, $NO_2$, amino group ($NH_2$, NH), OH, COOH, alkoxyl group (O—$CH_3$), and the like, and mixtures thereof. In embodiments, the phrase "unsubstituted fluorocarbon structure" indicates that there is absent any replacement of a hydrogen atom of the fluorine-containing organic compound/organic moiety with a substitutent described herein.

Unless otherwise noted, the phrase "fluorocarbon structure," refers to both the "unsubstituted fluorocarbon structure," and the "substituted fluorocarbon structure." In embodiments, the fluorocarbon-containing layer (e.g., SAM) is a product of a reaction of the gate dielectric and a precursor. The precursor comprises a material having the following formula:

X—Y wherein X is an reactive group with can react with certain functional group(s) on the gate dielectric surface, and Y is a fluorocarbon structure. In embodiments, X is selected from the groups of —$PO_3H_3$, —$OPO_3H_3$, —COOH, —$SiCl_3$, —$SiCl(CH_3)_2$, —$SiCl_2CH_3$, —$Si(OCH_3)_3$, —$SiCl_3$, —$Si(OC_2H_5)_3$, —OH, —SH, —CONHOH, —NCO, benzotriazolyl (—$C_6H_4N_3$), and the like. The fluorocarbon structure in the fluorocarbon-containing layer is a fluorinated hydrocarbon comprising the following exemplary number of carbon atoms and fluorine atoms: 1 to about 60 carbon atoms, or from about 3 to about 30 carbon atoms; and 1 to about 120 fluorine atoms, or from 2 to about 60 fluorine atoms. In embodiments, the fluorocarbon structure in the fluorocarbon-containing layer is a perfluorocarbon structure. In embodiments, the carbon atoms of the fluorocarbon structure in the fluorocarbon-containing layer are arranged in a chain of a length ranging for example from 3 to about 18 carbon atoms. In embodiments, the fluorocarbon structure is a linear or branched aliphatic or cyclic aliphatic group, a linear or branched group containing aromatic groups and/or aliphatic or cyclic aliphatic group, or an aromatic group. Reaction of the X group with the gate dielectric surface will result in a heteroatom containing moiety in the substance, wherein the heteroatom containing moiety is covalently bonded to both the fluorocarbon structure and the gate dielectric. Such a "heteroatom containing moiety" is not to be confused with the "heteroatom-containing group" for the "substituted fluorocarbon structure."

In embodiments, the precursor may be for example a fluoroalkylsilane or a fluoroalkylphosphine, or a mixture thereof, where the alkyl moiety includes for instance 1 to about 50 carbon atoms.

In embodiments, the substance-containing layer which is disposed between the gate dielectric and the semiconductor layer comprises a substance which includes a fluorine-containing polymer as the fluorocarbon structure. In embodiments, the fluorine-containing polymer is also called fluorinated polymer, which can be a fully or partially fluorinated polymer. The fluorine-containing polymer has a molecular weight for example from about 3000 to about 100,000. Any suitable fluorine-containing polymer may be used. Exemplary fluorine-containing polymers may include for example fully fluorinated fluorocarbon plastics, including polytetrafluoroethylene and its fully fluorinated copolymers, and fluoroplastics, containing hydrogen or chlorine in addition to fluorine on the carbon-carbon backbone. Specific fluorine-containing polymers may include for example polytetrafluoroethylene, polychlorotrifluoroethylene, poly(vinyl fluoride), and poly(vinylidene fluoride).

In fabricating a thin film transistor having the substance-containing layer, any suitable process may be employed. In embodiments where the substance in the layer is covalently bonded to the gate dielectric, the following exemplary process is used. A deposition composition comprising a precursor is deposited on the gate dielectric, wherein the precursor comprises the fluorocarbon structure and a reactive group covalently bonded to the fluorocarbon structure. Subsequent to deposition, the reactive group of the precursor reacts with the gate dielectric to form the substance comprising the fluorocarbon structure and a heteroatom containing moiety covalently bonded to the fluorocarbon structure and to the gate dielectric. In embodiments, the reactive group of the precursor spontaneously reacts with the gate dielectric.

In embodiments where the substance in the layer is not covalently bonded to the gate dielectric, for example a substance comprising a fluorine-containing polymer, the following exemplary process is used. A deposition composition comprising the substance in a suitable solvent is deposited on the gate dielectric through a coating processing such as spin coating, dip coating, gravure, inkjet, microcontact, stencil, and stamping printing.

The deposition composition may be deposited on the gate dielectric by any suitable technique such as for example spin coating, dip coating, gravure, inkjet, microcontact, stencil, and stamping printing, and the like.

In embodiments where drying of the deposited deposition composition is needed, drying may occur at any suitable temperature such as room temperature or an elevated temperature above room temperature ranging for example from about 30 to about 100 degrees C., where the drying time ranges for example from about 30 seconds to about 1 hour.

In embodiments, the deposition composition includes a liquid medium such as for example toluene, chloroform, chlorobenzene, octane, heptane, hexane, alcohol, acetic acid, N,N-dimethylformamide, tetrahydrofuran, and the like. Where the deposition composition includes a liquid medium, the concentration of the precursor/substance ranges from about 10% to about 90% by weight.

The thiophene compound present in the semiconductor layer may be a polymeric compound or a small molecule compound, or a mixture thereof. The phrase "polymeric compound" encompasses oligomers and polymers. In embodiments, a mixture comprising two or more thiophene compounds may be used.

In embodiments, the substituted thiophene units have the formula:

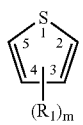

wherein m is 1, 2 or 3, wherein each substituted thiophene unit is the same or different from each other substituted thiophene unit in terms of substituent number, substituent identity, and substituent position, and wherein each $R_1$ is independently selected from the group consisting of:

(a) a hydrocarbon group,
(b) a heteroatom containing group, and
(c) a halogen.

Any suitable numbers of the substituted thiophene units and the unsubstituted thiophene units may be present in the thiophene compound. The number of the substituted thiophene units ranges for example from at least 1, or from 1 to about 30. The number of the unsubstituted thiophene units ranges for example from at least 1, or from 1 to about 30. These exemplary numbers of the substituted thiophene units and the unsubstituted thiophene units are for a small molecule thiophene compound. In the embodiments where the thiophene compound is a polymeric compound, the total numbers of the substituted thiophene units and the unsubstituted thiophene units are a multiple of those disclosed herein depending on the number of repeating units in the polymeric compound, where the number of repeating units may range for example from 2 to about 100.

As part of the thiophene compound, the substituted thiophene unit(s) and the unsubstituted thiophene unit(s) are covalent bonded at any available ring position(s) such as either or both of the second ring position and the fifth ring position. The substituted thiophene unit(s) and the unsubstituted thiophene unit(s) may be disposed in any suitable arrangement with each other and with the divalent linkage(s).

Illustrative examples of the divalent linkage for the thiophene compound are the following structures:

—CH═CH—     (1)

—C≡C—     (2)

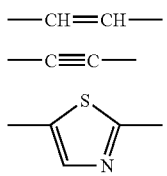     (3)

-continued

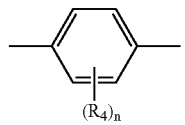     (4)

—CH$_2$—     (5)

—O—     (6)

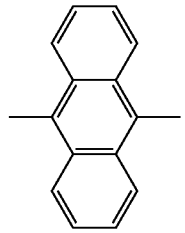     (7)

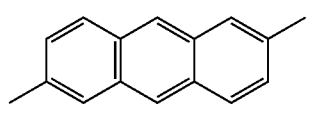     (8)

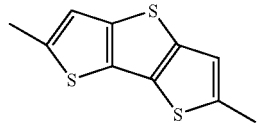     (9)

wherein n is 0, 1, 2, 3, or 4, and the substituents of $R_4$ are the same or different from each other within each divalent linkage and among different divalent linkages. $R_4$ may be a hydrocarbon group, a heteroatom containing group, and a halogen.

Any suitable number of the same or different divalent linkage may be present in the thiophene compound such as for example from 1 to about 3 divalent linkages. These exemplary numbers for the divalent linkage are for a small molecule thiophene compound. In the embodiments where the thiophene compound is a polymeric compound, the total number of the divalent linkage is a multiple of those disclosed herein depending on the number of repeating units in the polymeric compound, where the number of repeating units may range for example from 2 to about 100.

Hydrocarbon Group for $R_1$, $R_4$

The hydrocarbon group contains for example from 1 to about 25 carbon atoms, or from 1 to about 10 carbon atoms, and may be for example a straight chain alkyl group, a branched alkyl group, a cycloalkyl group, an aryl group, an alkylaryl group, and an arylalkyl group. Exemplary hydrocarbon groups include for example methyl, ethyl, propyl, butyl, pentyl, hexyl, heptyl, octyl, nonyl, decyl, undecyl, dodecyl, tridecyl, tetradecyl, pentadecyl, cyclopentyl, cyclohexyl, cycloheptyl, and isomers thereof.

The hydrocarbon group is optionally substituted one or more times with for example a halogen (chlorine, bromine, fluorine, and iodine).

Heteroatom Containing Group for $R_1$, $R_4$

The heteroatom containing group has for example 2 to about 50 atoms, or from 2 to about 30 atoms, and may be for example a nitrogen containing moiety, an alkoxy group, a heterocyclic system, an alkoxyaryl, and an arylalkoxy. Exemplary heteroatom containing groups include for example cyano, nitro, methoxyl, ethoxyl, and propoxy.

Halogen for $R_1$, $R_4$

The halogen may be chlorine, bromine, fluorine, and iodine.

In embodiments, the substituent $R_1$ is regioregularly positioned on the thiophene compounds. The regioregularly positioned substituents facilitate proper alignment of the thiophene compound to form highly ordered microstructure domains in thin films. It is believed that these thiophene compounds when deposited as thin films of, for example, about 10 nanometers to about 500 nanometers form closely stacked lamella structures that are conducive to efficient charge carrier transport. The incorporated unsubstituted thiophene unit(s) and optional divalent linkage(s) have some degree of rotational freedom, which helps to disrupt the extended π—conjugation of the thiophene compounds to an extent that may be sufficient to suppress its propensity towards oxidative doping. Accordingly, in embodiments, these thiophene compounds and the devices fabricated from these thiophene compounds are stable in ambient conditions.

Any suitable small molecular thiophene compounds may be used in the semiconductor layer such as those disclosed for example in Beng Ong et al., U.S. application Ser. No. 10/865,445, filed Jun. 10, 2004, the disclosure of which is totally incorporated by reference.

In particular, exemplary small molecular thiophene compounds are for example:

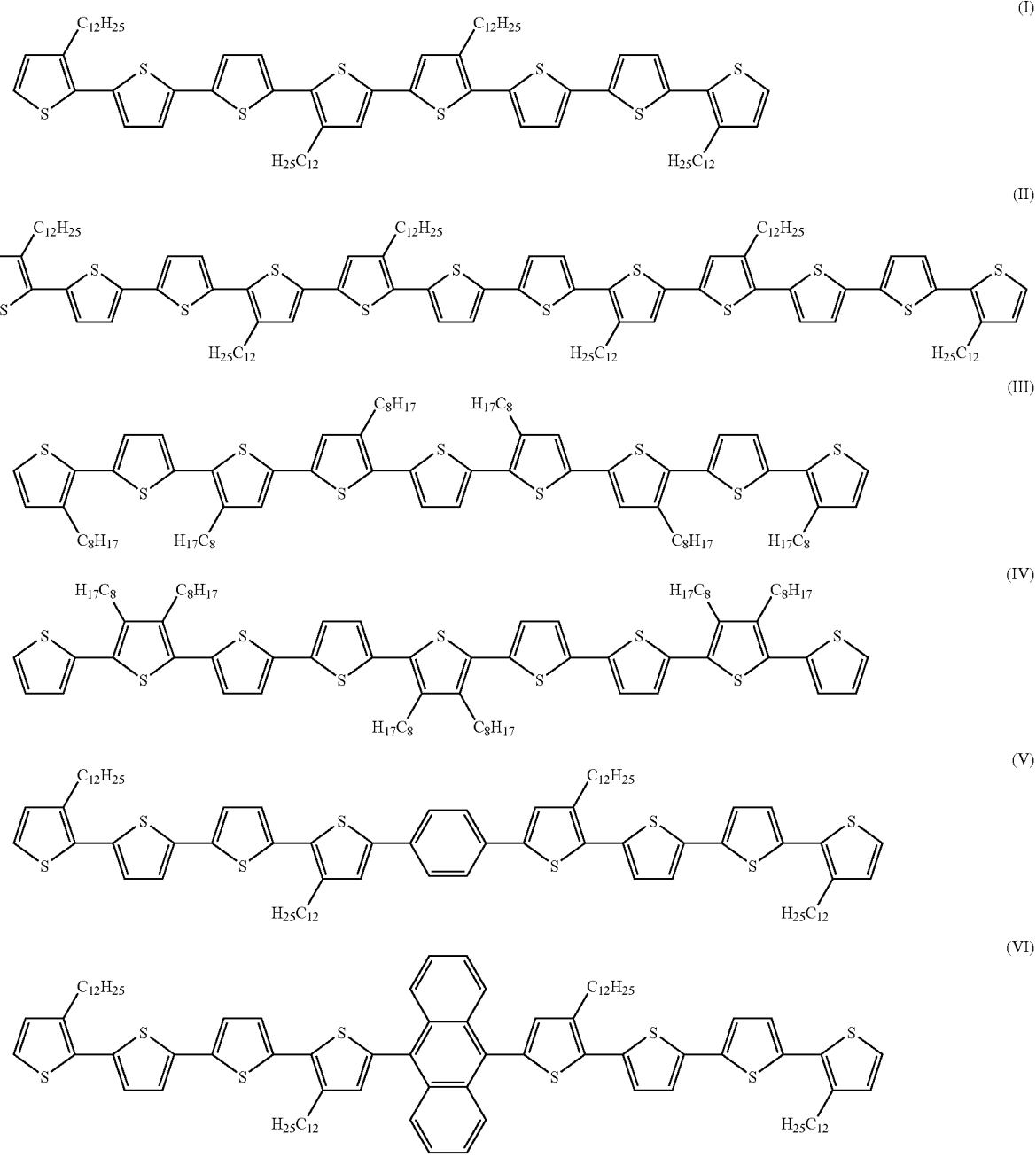

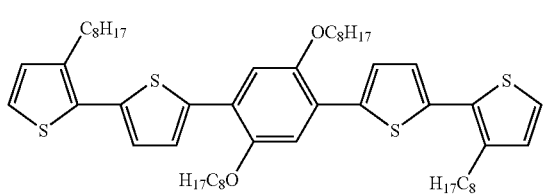
(VII)
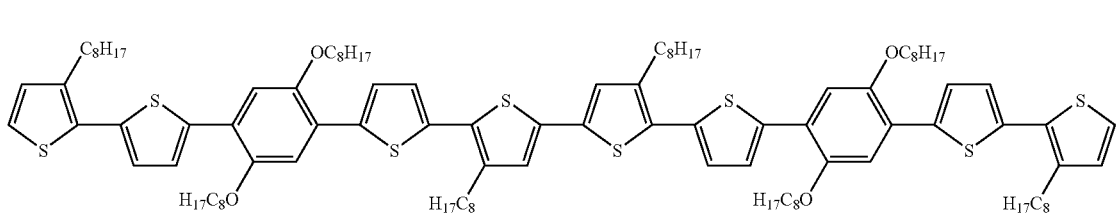
(VIII)
Any suitable polymeric thiophene compound may be used in the semiconductor layer such as those disclosed for example in Ong et al., U.S. Pat. No. 6,770,904 B2, the disclosure of which is totally incorporated by reference.
Exemplary polymeric thiophene compounds are for example:
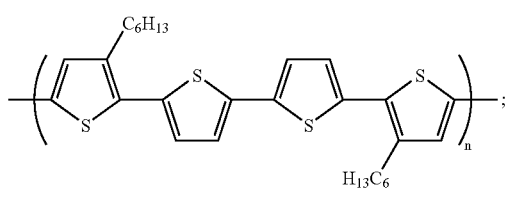
(a)
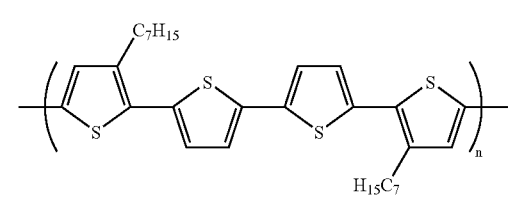
(b)
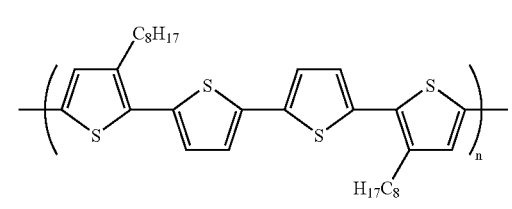
(c)
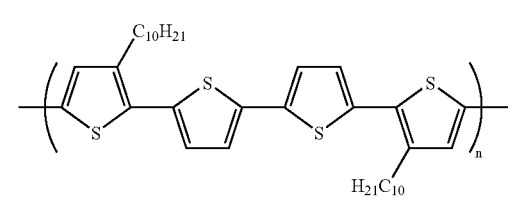
(d)
-continued
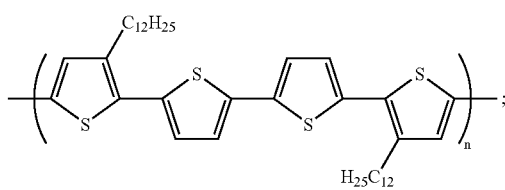
(e)
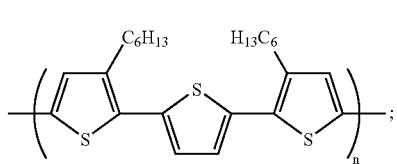
(f)
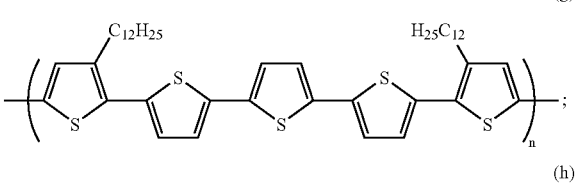
(g)
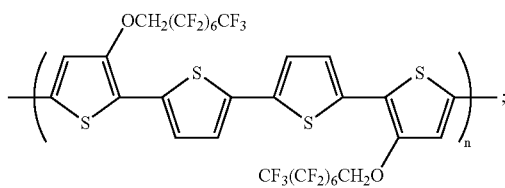
(h)
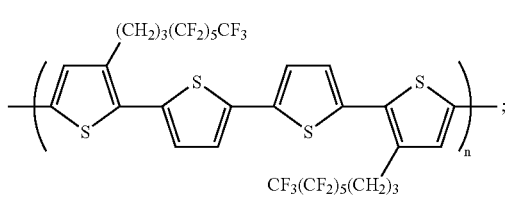
(i)

-continued

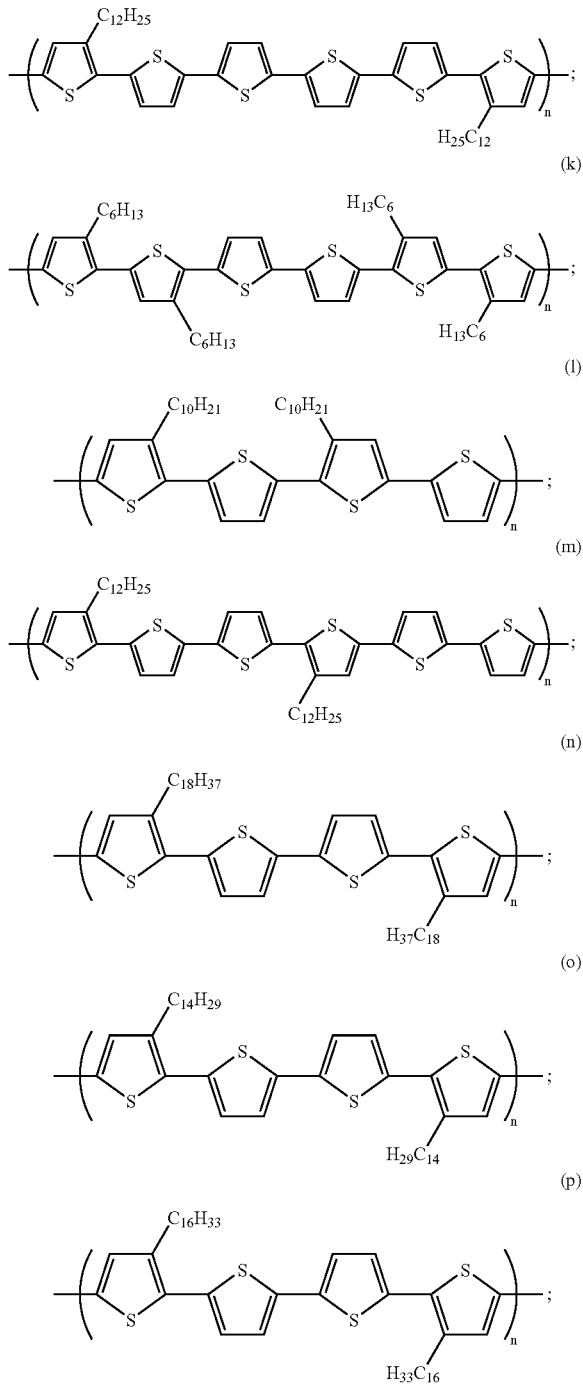

wherein for the polymeric thiophene compounds n is any suitable value, for example at least 2, or from 2 to about 100.

The thiophene compound may be a p-type semiconductor compound or a n-type semiconductor compound, depending on the substituents. In general, substituents with electron-donating property such as a hydrocarbon like alkyl, alkyloxy and phenylene groups will make the molecule electron-rich, thus turning the molecule into p-type; while substituents with electron-withdrawing ability such as cyano, nitro, fluoro, and fluorinated alkyl groups will make the thiophene molecule electron-deficient, thus turning the thiophene compound into a n-type semiconductor.

Any suitable techniques may be used to form the semiconductor layer containing the thiophene compound. One such method is by vacuum evaporation at a vacuum pressure of about $10^{-5}$ to $10^{-7}$ torr in a chamber containing a substrate and a source vessel that holds the thiophene compound in powdered form. Heat the vessel until the thiophene compound sublimes onto the substrate. The performance of the films containing the thiophene compound depends on the rate of heating, the maximum source temperature and/or substrate temperature during process. In embodiments, liquid deposition techniques may also be used to fabricate a thin film containing the thiophene compound. The phrase "liquid deposition techniques" refers to for example spin coating, blade coating, rod coating, screen printing, ink jet printing, stamping and the like. In embodiments, the thiophene compound is dissolved in a suitable liquid of for example tetrehydrofuran, dichlorormethane, chlororbenzene, toluene, and xylene at a concentration of about 0.1% to 10%, particularly 0.5% to 5% by weight, followed by spin coating at a speed of about 500 to 3000 rpm, particularly 1000-2000 rpm, for a period of time of about 5 to 100 seconds, particularly about 30 to 60 seconds at room temperature or an elevated temperature.

In FIG. 1, there is schematically illustrated a thin film transistor ("TFT") configuration 10 comprised of a substrate 16, in contact therewith a metal contact 18 (gate electrode) and a layer of a gate dielectric 14, a layer 15 containing the substance comprising the fluorocarbon structure, on top of which two metal contacts, source electrode 20 and drain electrode 22, are deposited. Over and between the metal contacts 20 and 22 is an organic semiconductor layer 12 as illustrated herein.

Figure 2:
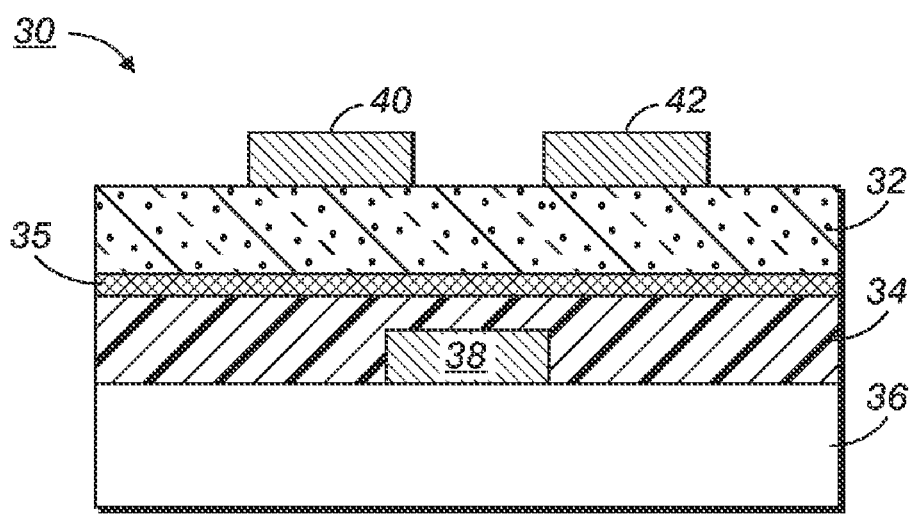
FIG. 2 represents a second embodiment of the present invention in the form of a thin film transistor.

FIG. 2 schematically illustrates another TFT configuration 30 comprised of a substrate 36, a gate electrode 38, a source electrode 40 and a drain electrode 42, a gate dielectric 34, a layer 35 containing the substance comprising the fluorocarbon structure, and an organic semiconductor layer 32.

Figure 3:
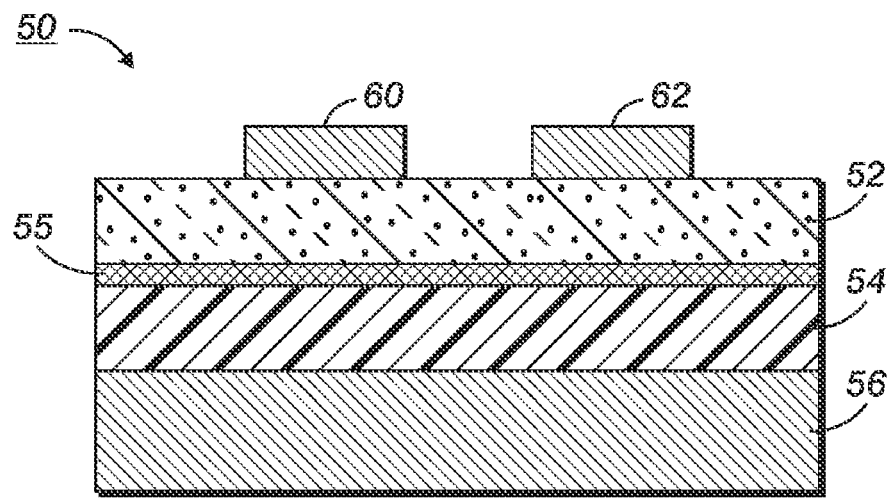
FIG. 3 represents a third embodiment of the present invention in the form of a thin film transistor.

FIG. 3 schematically illustrates a further TFT configuration 50 comprised of a heavily n-doped silicon wafer 56 which acts as both a substrate and a gate electrode, a thermally grown silicon oxide gate dielectric 54, a layer 55 containing the substance comprising the fluorocarbon structure, and an organic semiconductor layer 52, on top of which are deposited a source electrode 60 and a drain electrode 62.

Figure 4:
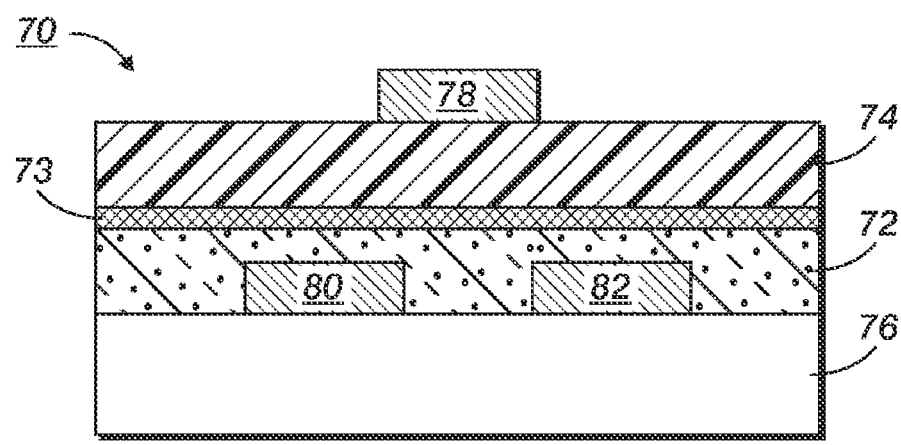
FIG. 4 represents a fourth embodiment of the present invention in the form of a thin film transistor.

FIG. 4 schematically illustrates an additional TFT configuration 70 comprised of substrate 76, a gate electrode 78, a source electrode 80, a drain electrode 82, an organic semiconductor layer 72, a layer 73 containing the substance comprising the fluorocarbon structure, and a gate dielectric 74.

The substrate may be composed of for instance silicon, glass plate, plastic film or sheet. For structurally flexible devices, plastic substrate, such as for example polyester, polycarbonate, polyimide sheets and the like may be preferred. The thickness of the substrate may be from about 10 micrometers to over 10 millimeters with an exemplary thickness being from about 50 to about 100 micrometers, especially for a flexible plastic substrate and from about 1 to about 10 millimeters for a rigid substrate such as glass or silicon.

The compositions of the gate electrode, the source electrode, and the drain electrode are now discussed. The gate electrode can be a thin metal film, a conducting polymer film, a conducting film made from conducting ink or paste or the substrate itself, for example heavily doped silicon. Examples of gate electrode materials include but are not restricted to aluminum, gold, chromium, indium tin oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as ELECTRODAG™ available from Acheson Colloids Company. The gate electrode can be prepared by vacuum evaporation, sputtering of metals or conductive metal oxides, coating from conducting polymer solutions or conducting inks by spin coating, casting or printing. The thickness of the gate electrode ranges for example from about 10 to about 200 nanometers for metal films and in the range of about 1 to about 10 micrometers for polymer conductors. The source and drain electrodes can be fabricated from materials which provide a low resistance ohmic contact to the semiconductor layer. Typical materials suitable for use as source and drain electrodes include those of the gate electrode materials such as gold, nickel, aluminum, platinum, conducting polymers and conducting inks. Typical thicknesses of source and drain electrodes are about, for example, from about 40 nanometers to about 1 micrometer with the more specific thickness being about 100 to about 400 nanometers.

In embodiments, the gate dielectric is composed of one, two, or more layers. The gate dielectric generally can be for example an inorganic material film or an organic polymer film. Illustrative examples of inorganic materials suitable as the gate dielectric include silicon oxide, silicon nitride, aluminum oxide, barium titanate, barium zirconium titanate and the like; illustrative examples of organic polymers for the gate dielectric include polyesters, polycarbonates, poly (vinyl phenol), polyimides, polystyrene, poly(methacrylate)s, poly(acrylate)s, epoxy resin and the like. The thickness of the gate dielectric is, for example from about 10 nanometers to about 500 nanometers depending on the dielectric constant of the dielectric material used. An exemplary thickness of the gate dielectric is from about 100 nanometers to about 500 nanometers. The gate dielectric may have a conductivity that is for example less than about $10^{-12}$ S/cm. Exemplary gate dielectrics are disclosed in Janos Veres et al., "Gate insulators in organic field-effect transistors," *Chem. Mater.* Vol. 16, pp. 4543-4555 (published on web Sep. 11, 2004), the disclosure of which is totally incorporated herein by reference.

In embodiments, the gate dielectric, the gate electrode, the semiconductor layer, the source electrode, and the drain electrode are formed in any sequence where the gate electrode and the semiconductor layer both contact the gate dielectric, and the source electrode and the drain electrode both contact the semiconductor layer. The phrase "in any sequence" includes sequential and simultaneous formation. For example, the source electrode and the drain electrode can be formed simultaneously or sequentially. The composition, fabrication, and operation of field effect transistors are described in Bao et al., U.S. Pat. No. 6,107,117, the disclosure of which is totally incorporated herein by reference.

The semiconductor layer has a thickness ranging for example from about 10 nanometers to about 1 micrometer with a preferred thickness of from about 20 to about 200 nanometers. The TFT devices contain a semiconductor channel with a width W and length L. The semiconductor channel width may be, for example, from about 1 micrometers to about 5 millimeters, with a specific channel width being about 5 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally, for example, about 0 volt to about −80 volts is applied to the drain electrode to collect the charge carriers transported across the semiconductor channel when a voltage of generally about +20 volts to about −80 volts is applied to the gate electrode.

Regarding electrical performance characteristics, a semiconductor layer of the present electronic device has a carrier mobility greater than for example about $10^{-3}$ cm$^2$/Vs (centimeters$^2$/Volt-second) and a conductivity less than for example about $10^{-4}$ S/cm (Siemens/centimeter). The thin film transistors produced by the present process have an on/off ratio greater than for example about $10^3$ at 20 degrees C. The phrase on/off ratio refers to the ratio of the source-drain current when the transistor is on to the source-drain current when the transistor is off.

The invention will now be described in detail with respect to specific exemplary embodiments thereof, it being understood that these examples are intended to be illustrative only and the invention is not intended to be limited to the materials, conditions, or process parameters recited herein. All percentages and parts are by weight unless otherwise indicated. As used herein, room temperature refers to a temperature ranging for example from about 20 to about 25 degrees C.

COMPARATIVE EXAMPLE 1

There was selected a top-contact thin film transistor configuration as schematically illustrated, for example, in FIG. 3.

The device was comprised of a n-doped silicon wafer with a thermally grown silicon oxide layer of a thickness of about 110 nanometers thereon. The wafer functioned as the gate electrode while the silicon oxide layer acted as the gate dielectric and had a capacitance of about 30 nF/cm$^2$ (nanofarads/square centimeter) as measured with a capacitor meter. The fabrication of the device was accomplished at ambient conditions without any precautions to exclude the materials and device from exposure to ambient oxygen, moisture, or light. The silicon wafer was first cleaned with isopropanol, air dried, then cleaned with an argon plasma and washed with distilled water and isopropanol. This surface has an advanced water contact angle of 37±2°.

The following polythiophene (having a structure as previously shown in embodiment (e)) was used to fabricate the semiconductor layer, where this polymer possessed a M$_w$ of 22,900 and M$_n$ of 17,300 relative to polystyrene standards. This polythiophene and its preparation are described in U.S. Patent Application Publication No. 2003/0160230, the disclosure of which is totally incorporated herein by reference. The semiconductor polythiophene layer of about 30 nanometers in thickness was deposited on top of the device by spin coating of the polythiophene in dichlorobenzene solution at a speed of 1,000 rpm for about 100 to about 120 seconds, and dried in vacuo at 80° C. for about 2 to about 10 hours. Thereafter, the gold source and drain electrodes were deposited on top of the semiconductor polythiophene layer by vacuum deposition through a shadow mask with various channel lengths and widths, thus creating a series of transistors of various dimensions.

The evaluation of field-effect transistor performance was accomplished in a black box at ambient conditions using a Keithley 4200 SCS semiconductor characterization system.

The carrier mobility, μ, was calculated from the data in the saturated regime (gate voltage, $V_G$<source-drain voltage, $V_{SD}$) according to equation (1)

$$I_{SD}=C_i\mu(W/2L)(V_G-V_T)^2 \quad (1)$$

where $I_{SD}$ is the drain current at the saturated regime, W and L are, respectively, the semiconductor channel width and length, Ci is the capacitance per unit area of the gate dielectric layer, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}$=0.

Another property of the field-effect transistor is its current on/off ratio. This is the ratio of the saturation source-drain current when the gate voltage $V_G$ is equal to or greater than the drain voltage $V_D$ to the source-drain current when the gate voltage $V_G$ is zero.

Thin film transistors with channel lengths of about 90 micron and channel widths of about 5000 microns were characterized by measuring the output and transfer curves. The devices exhibited field-effect mobility of 0.004 cm²/V·s and current on/off ratio of about $10^4$-$10^5$.

COMPARATIVE EXAMPLE 2

In this comparative example, the devices were fabricated using the same procedure in Comparative Example 1 except that the gate dielectric surface was modified with a layer of octyltrichlorosilane (OTS8) as follows. The cleaned substrates were immersed in a 0.1 M solution of octyltrichlorosilane in toluene for about 20 minutes at about 60° C. The substrates were subsequently washed with toluene and isopropanol and dried before deposition of the semiconductor layer. The formation of the OTS8 layer was verified by contact angle measurement. The surface has an advanced water contact angle of 91±1°

Thin film transistors with channel lengths of about 90 micron and channel widths of about 5000 microns were characterized by measuring the output and transfer curves. The devices exhibited field-effect mobility of 0.01-0.038 cm²/V·s and current on/off ratio of about $10^6$-$10^7$.

EXAMPLE 1

In this example, the devices were fabricated using the same procedure in Comparative Example 1 except that the gate dielectric surface was modified with a layer of 1H,1H, 2H,2H-perfluorooctyltrichlorosilane (FOTS8) as follows. The cleaned substrates were immersed in a 0.01 M solution of FOTS8 in toluene for about 20 minutes at about 60° C. The substrates were subsequently washed with toluene and isopropanol and dried before deposition of the semiconductor layer. The formation of the FOTS8 layer was verified by contact angle measurement. The surface has an advanced water contact angle of 103±2°

Thin film transistors with channel lengths of about 90 micron and channel widths of about 5000 microns were characterized by measuring the output and transfer curves. The devices exhibited field-effect mobility of 0.06-0.1 cm²/V·s and current on/off ratio of about $10^6$-$10^7$. The mobility was improved by 150 to 250 times compared with the devices without a modification layer (Comparative Example 1), and improved by 3 to 5 times compared with the device modified with a layer of OTS8 (Comparative Example 2).

It will be appreciated that various of the above-disclosed and other features and functions, or alternatives thereof, may be desirably combined into many other different systems or applications. Various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

The invention claimed is:

1. A thin film transistor comprising:
   (a) a semiconductor layer including a thiophene compound, wherein the thiophene compound comprises one or more substituted thiophene units, one or more unsubstituted thiophene units, and optionally one or more divalent linkages wherein the thiophene compound exhibits a regioregular structure;
   (b) a gate dielectric; and
   (c) a layer contacting the gate dielectric disposed between the semiconductor layer and the gate dielectric, wherein the layer comprises a substance comprising a fluorocarbon structure.

2. The transistor of claim 1, wherein the gate dielectric comprises silicon oxide.

3. The transistor of claim 1, wherein the layer is a self-assembled monolayer.

4. The transistor of claim 1, wherein the layer has a thickness ranging from about 0.5 nm to about 500 nm.

5. The transistor of claim 1, wherein the substance further comprises a heteroatom containing moiety covalently bonded to both the fluorocarbon structure and the gate dielectric.

6. The transistor of claim 5, wherein the heteroatom containing moiety comprises a silicon atom or a phosphorus atom.

7. The transistor of claim 1, wherein the substance is a fluoroalkylsilane.

8. The transistor of claim 1, wherein the thiophene compound is a polymeric compound.

9. The transistor of claim 1, wherein the thiophene compound is a homopolymer.

10. The transistor of claim 1, wherein the thiophene compound is a small molecule compound.

11. A thin film transistor comprising:
    (a) a semiconductor layer including a thiophene compound, wherein the thiophene compound comprises one or more substituted thiophene units, one or more unsubstituted thiophene units, and optionally one or more divalent linkages, wherein the thiophene compound is a polymer;
    (b) a gate dielectric; and
    (c) a layer contacting the gate dielectric disposed between the semiconductor layer and the gate dielectric, wherein the layer comprises a fluoroalkylsilane or a fluoroalkylphosphine, or a mixture thereof.

12. A thin film transistor comprising:
    (a) a semiconductor layer including a thiophene compound, wherein the thiophene compound comprises one or more substituted thiophene units, one or more unsubstituted thiophene units, and optionally one or more divalent linkages;
    (b) a gate dielectric; and
    (c) a layer contacting the gate dielectric disposed between the semiconductor layer and the gate dielectric, wherein the layer comprises a substance comprising a fluorocarbon structure wherein the fluorocarbon structure is a perfluorocarbon structure.

13. A thin film transistor comprising:
(a) a semiconductor layer including a thiophene compound, wherein the thiophene compound comprises one or more substituted thiophene units, one or more unsubstituted thiophene units, and optionally one or more divalent linkages;
(b) a gate dielectric; and
(c) a layer contacting the gate dielectric disposed between the semiconductor layer and the gate dielectric, wherein the layer comprises a substance comprising a fluorocarbon structure wherein the fluorocarbon structure is an unsubstituted fluorocarbon structure.

* * * * *

UNITED STATES PATENT AND TRADEMARK OFFICE
CERTIFICATE OF CORRECTION

PATENT NO. : 7,282,735 B2  Page 1 of 1
APPLICATION NO. : 11/276694
DATED : October 16, 2007
INVENTOR(S) : Yiliang Wu et al.

It is certified that error appears in the above-identified patent and that said Letters Patent is hereby corrected as shown below:

In the Specification

Column 1, line 16, after "Cooperative Agreement No.", please delete "70NAN-BOH3033" and insert --70NAN-B0H3033--.

Signed and Sealed this
Seventeenth Day of September, 2013

Teresa Stanek Rea
*Deputy Director of the United StatesPatent and Trademark Office*